(12) United States Patent
Gienger

(10) Patent No.: US 6,408,037 B1
(45) Date of Patent: Jun. 18, 2002

(54) HIGH-SPEED DATA DECODING SCHEME FOR DIGITAL COMMUNICATION SYSTEMS

(75) Inventor: Dean Gienger, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/175,237

(22) Filed: Oct. 20, 1998

(51) Int. Cl.[7] .............................. H04L 27/06; G06F 7/02
(52) U.S. Cl. ........................ 375/340; 714/709; 714/819
(58) Field of Search ................................. 375/340, 324, 375/316, 242, 262, 265, 341, 349, 377; 329/311; 341/143; 714/704, 709, 746, 795, 799, 812, 819

(56) References Cited

U.S. PATENT DOCUMENTS

| | | | |
|---|---|---|---|
| 5,469,452 A | 11/1995 | Zehavi | 714/792 |
| 5,633,881 A | 5/1997 | Zehavi et al. | 714/756 |
| 5,710,784 A | 1/1998 | Kindred et al. | 375/262 |
| 6,038,264 A | * 3/2000 | Uesugi | 375/316 |

* cited by examiner

*Primary Examiner*—Betsy L. Deppe
(74) *Attorney, Agent, or Firm*—John L. Imperato

(57) ABSTRACT

A data decoding scheme operates on individual code symbols within an encoded data stream, enabling data to be recovered from the code symbols at a high rate. The decoding scheme, typically included within a receiver of a digital communication system or data network, does not rely on processing and storing multiple code symbols and is unencumbered by storage memory elements and decoding rate limitations associated with receiving and processing blocks of multiple code symbols. The decoding scheme generates bit sequences corresponding to each alternate data state of a received code symbol. Error vectors are generated as a result of comparing each of the generated bit sequences to the received code symbol. The data state of data represented by the code symbol within the encoded data stream is recovered from the code symbol by selecting the minimum of the generated error vectors.

8 Claims, 2 Drawing Sheets

HIGH-SPEED DATA DECODING SCHEME FOR DIGITAL COMMUNICATION SYSTEMS

BACKGROUND OF THE INVENTION

The reliability of data transmission within a digital communication system depends on the signal-to-noise ratio (SNR) of the communication system. For example, the bit error rate (BER), a measure of the reliability of data transmission through the communication system, increases as the SNR decreases. Data encoders and data decoders are used within digital communication systems and are designed to provide coding gain to improve the effective SNR and decrease the BER of the system. Decoders within receivers of the digital communication systems are used to recover data subsequent to data encoding and transmission. A decoder taught by Kindred et al. in U.S. Pat. No. 5,710,784 operates on frame packets of data containing multiple code symbols. This decoder also uses a chain-back process that traces backward to recover the original data from the encoded data. The chain-back process and storage of multiple code symbols relies on memory elements and limits the rate at which data is recovered by the decoder. As data rates within digital communications systems continue to increase, limitations in data recovery rates become less tolerable and the need for high-speed data decoders becomes more pressing.

SUMMARY OF THE INVENTION

According to the preferred embodiment of the present invention, a data decoding scheme operates on individual code symbols within an encoded data stream, enabling data to be recovered from the code symbols at a high rate. The decoding scheme, typically included within a receiver of a digital communication system or data network, does not rely on processing and storing multiple code symbols and is unencumbered by storage memory elements and decoding rate limitations associated with receiving and processing blocks of multiple code symbols. The decoding scheme generates bit sequences that correspond to each alternative data state of a received code symbol. Error vectors are generated as a result of comparing each of the generated bit sequences to the received code symbol. The data state of data within the encoded data stream is recovered from the code symbol by selecting the minimum of the generated error vectors.

DETAILED DESCRIPTION OF THE PREFERRED EMBODIMENT

Figure 1:
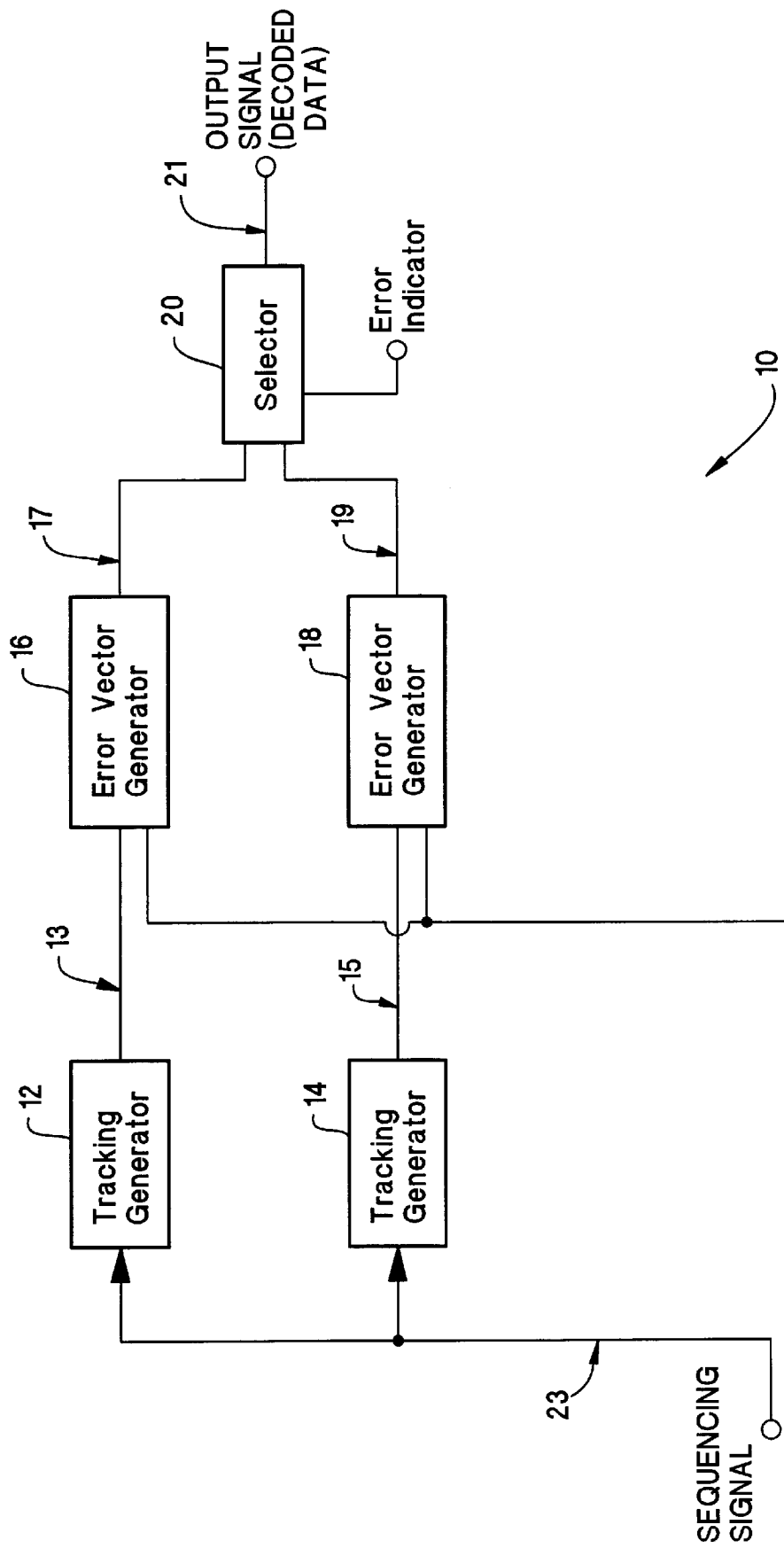
FIG. 1 is functional diagram of the data decoding scheme constructed according to the preferred embodiment of the present invention.

FIG. 1 is a functional diagram of the data decoding scheme constructed according to the preferred embodiment of the present invention. In the functional diagram, a decoder 10 receives an encoded data stream 11 in which the data state, such as a logic one or logic zero, of each data bit has been encoded or represented by a code symbol. Typically, the decoder 10 is included within a receiver of a digital communication system or data network and is used to recover, or decode, the data states of the data or data bits from the code symbols. As the length of the code symbols increases, the coding gain of the system increases causing the reliability of data transmission within the system to correspondingly increase. In some types of digital communications systems or data networks, each code symbol in the encoded data stream 11 is encoded independent of successive code symbols. In other types of digital communication systems or data networks, convolutional encoding is used, making the code symbols dependent on successive or neighboring code symbols in the encoded data stream 11.

The decoder 10 operates on individual code symbols within the encoded data stream 11. In this example, each code symbol represents one of two possible alternative data states. A first tracking generator 12 produces a first bit sequence 13 that corresponds to an ideal representation of a first of the alternative data states, such as a logic zero, of a predefined code symbol from the encoded data stream 11. A second tracking generator 14 produces a second bit sequence 15 that corresponds to an ideal representation of a second of the alternative data states, such as a logic one, of the predefined code symbol. When the code symbols are sequence dependent, or depend upon successive or neighboring code symbols in the data stream 11, the first and second bit sequences are established according to a sequencing signal 23 provided to the decoder 10, to assure that each of the first and second bit sequences 13, 15 track the encoding designation of the predefined code symbols.

A first error vector generator 16 receives the predefined code symbol from the encoded data stream 11 and the first bit sequence 13 from the first tracking generator 12. The first error vector generator 16 produces a first error vector 17 based on a comparison of the first bit sequence 13 and the code symbol.

Various comparisons are used to produce the first error vector 17. In one example, the first error vector 17 is an integer designating the number of differing bits between the first bit sequence 13 and the code symbol resulting from a bit-by-bit comparison of the first bit sequence 13 and the code symbol. In another example, the comparison includes a weighting of successive bits within the first bit sequence 13 and the code symbol, and a comparison of the weighted bits. Alternatively, the first error vector 17 results from a comparison of a series of first bit sequences 13 and a series of code symbols.

A second error vector generator 18 receives the predefined code symbol from the encoded data stream 11 and the second bit sequence 15 from the second tracking generator 14. The second error vector generator 18 produces a second error vector 19 based on a comparison of the second bit sequence 15 and the code symbol. The comparison of the second bit sequence 15 and the code symbol is equivalent to the comparison used by the first error vector generator 16 to compare the first bit sequence 13 and the code symbol.

The first error vector 17 and the second error vector 19 are applied to a selector 20 which produces a data signal 21 having a data state that corresponds to the data state of the data represented by the predefined code symbol. As multiple code symbols are applied to the decoder 10 over time, the data signal 21 produced is the decoded data from the encoded data stream 11. When the code symbols are sequence dependent, or depend upon successive or neighboring code symbols in the data stream 11, the data signal 21 is optionally fed back to the first tracking generator 12 and the second tracking generator 14 to provide sequencing to establish tracking of the first bit sequence 13 and the second bit sequence 15 to the encoding designation of the code symbols.

The data state of the decoded data in the data signal 21, corresponds to the data state represented by the first bit sequence 13 when the first error vector 17 is less than the second error vector 19, and corresponds to the data state represented by the second bit sequence 15 when the second error vector 19 is less than the first error vector 17. When the first error vector 17 is not less than the second error vector 19 and the second error vector 19 is not less than the first error vector 17, either data state is assigned to the decoded data in the data signal 21. The first and second error vectors 17, 19 also enable the decoder 10 to indicate decoding errors, presence of excessive noise or other problems within the encoded data stream 11, the digital communication system or the data network. For example, as the data states of the encoded data become less distinguishable, the difference between the first and second error vectors 17, 19 decreases. When the first and second error vectors 17, 19 differ by less then a predetermined amount, an error indication is provided by an error indicator of the selector 20.

Figure 2:
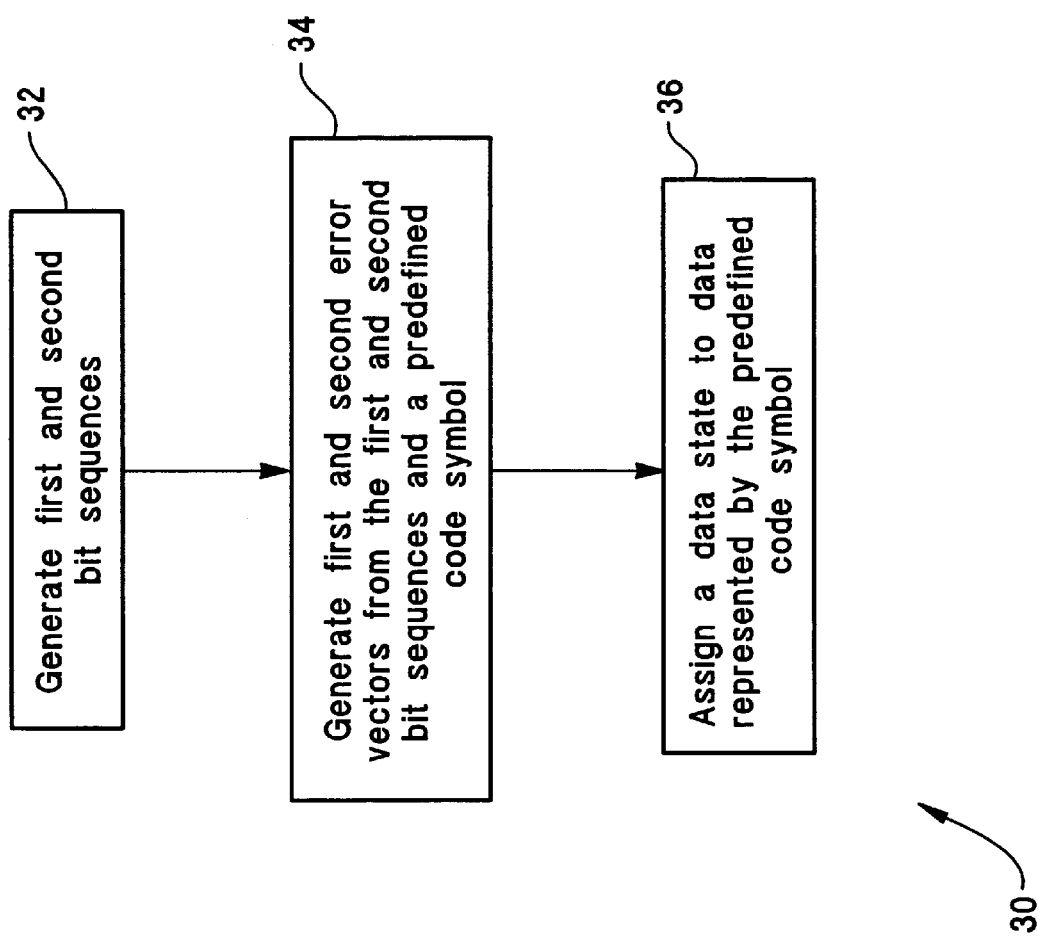
FIG. 2 is a flow diagram of the data decoding scheme constructed according to the preferred embodiment of the present invention.

FIG. 2 is a flow diagram 30 of the data decoding scheme constructed according to the preferred embodiment of the present invention. In the flow diagram 30 of the decoding scheme, data is decoded from code symbols within an encoded data stream. In step 32 of the decoding scheme, a first bit sequence and a second bit sequence are generated. The first bit sequence corresponds to an ideal representation of a first of two alternative data states, such as a logic zero, of a predefined one of the code symbols from the data stream. The second bit sequence corresponds to an ideal representation of a second of two alternative data states, such as a logic one, of the predefined code symbol. When the code symbols are sequence dependent, or depend upon successive or neighboring code symbols in the data stream, the first and second bit sequences are established according to a sequencing signal to assure that each of the first and second bit sequences track the encoding designation of the predefined code symbols.

In step 34, a first error vector is generated based on a comparison of the predefined code symbol and the first bit sequence, and a second error vector is generated based on a comparison of the predefined code symbol and the second bit sequence. In one example, the first error vector is an integer designating the number of differing bits between the first bit sequence and the code symbol resulting from a bit-by-bit comparison of the first bit sequence and the code symbol, or the error vector includes a weighting of successive bits within the first bit sequence and the code symbol, and a comparison of the weighted bits. Alternatively, the first error vector results from a comparison of a series of first bit sequences with a series of code symbols. The comparison of the second bit sequence and the code symbol producing the second error vector is equivalent to the comparison of the first bit sequence and the code symbol used to produce the first error vector.

In step 36, a data state is assigned to the data or data bits represented by the predefined code symbol. The assigned data state results from a comparison of the first error vector and the second error vector. The assigned data state corresponds to the data state represented by the first bit sequence when the first error vector is less than the second error vector, and corresponds to the data state represented by the second bit sequence when the second error vector is less than the first error vector. When the first error vector is not less than the second error vector and the second error vector is not less than the first error vector, either data state is assigned to the decoded data. The first and second error vectors also enable the decoding scheme to indicate decoding errors, presence of excessive noise or other problems within the encoded data stream 11, the digital communication system or data network. For example, as the data states of the encoded data become less distinguishable the difference between the first and second error vectors decreases. If the first and second error vectors differ by less then a predetermined amount, the decoding scheme 30 indicates an error.

In the preferred embodiment of the present invention a first bit sequence and a second bit sequence are generated when the data encoded in each code symbol has one of two alternative data states. When the code symbol represents data having a greater number of alternate data states the number of bit sequences generated is increased accordingly so that each generated bit sequence corresponds to one of the alternative data states.

While the preferred embodiment of the present invention has been illustrated in detail, it should be apparent that modifications and adaptations to this embodiment may occur to one skilled in the art without departing from the scope of the present invention as set forth in the following claims.

What is claimed is:

1. A data decoder for recovering a data signal from code symbols within an encoded data stream, comprising:

a first tracking generator producing a first bit sequence corresponding to a first alternative data state of a predefined code symbol within the encoded data stream;

a second tracking generator producing a second bit sequence corresponding to a second alternative data state of the predefined code symbol within the encoded data stream;

a first error vector generator coupled to the first tracking generator, receiving the first bit sequence and the predefined code symbol, producing a first error vector based on a comparison of the first bit sequence and the predefined code symbol;

a second error vector generator coupled to the second tracking generator, receiving the second bit sequence and the predefined code symbol, producing a second error vector based on a comparison of the second bit sequence and the predefined code symbol;

a selector coupled to the first error vector generator receiving the first error vector, and coupled to the second error vector generator receiving the second error vector, the selector producing a data signal having the first alternative data state in accordance with the first error vector being less than the second error vector and having the second alternative data state in accordance with the second error vector being less than the first error vector.

2. The data decoder of claim 1 wherein the selector indicates an error when the first error vector differs from the second error vector by less than a predetermined amount.

3. The data decoder of claim 1 wherein the comparison of the first bit sequence and the predefined code symbol includes a bit-by-bit comparison of the first bit sequence and the predefined code symbol and the comparison of the second bit sequence and the predefined code symbol includes a bit-by-bit comparison of the second bit sequence and the predefined code symbol.

4. The data decoder of claim 1 wherein the comparison of the first bit sequence and the predefined code symbol includes weighting bits within the first bit sequence and the predefined code symbol, and the comparison of the second bit sequence and the predefined code symbol includes weighting bits within the second bit sequence and the predefined code symbol.

5. A method for recovering data from code symbols within an encoded data stream, comprising the steps of:

producing a first bit sequence corresponding to a first alternative data state represented by a predefined code symbol within the encoded data stream;

producing a second bit sequence corresponding to a second alternative data state represented by the predefined code symbol within the encoded data stream;

generating a first error vector based on a comparison of the first bit sequence and the predefined code symbol;

generating a second error vector based on a comparison of the second bit sequence and the predefined code symbol;

assigning the first alternative data state to the data recovered from the predefined code symbol in accordance with the first error vector being less than the second error vector and assigning the second alternative data state to data recovered from the predefined code symbol in accordance with the second error vector being less than the first error vector.

6. The method of claim 5 further comprising the step of indicating an error when the first error vector differs from the second error vector by less than a predetermined amount.

7. The method of claim 5 wherein the comparison of the first bit sequence and the predefined code symbol includes a bit-by-bit comparison of the first bit sequence and the predefined code symbol and the comparison of the second bit sequence and the predefined code symbol includes a bit-by-bit comparison of the second bit sequence and the predefined code symbol.

8. The method of claim 5 wherein the comparison of the first bit sequence and the predefined code symbol includes weighting bits within the first bit sequence and the predefined code symbol, and the comparison of the second bit sequence and the predefined code symbol includes weighting bits within the second bit sequence and the predefined code symbol.

* * * * *